United States Patent [19]

Rossi et al.

[11] Patent Number: 4,950,919
[45] Date of Patent: Aug. 21, 1990

[54] MOS-TRANSISTOR BRIDGE CIRCUIT

[75] Inventors: Domenico Rossi, Cilavegna; Claudio Diazzi; Carlo Cini, both of Milan, Italy

[73] Assignee: SGS-Thomson Microelectronics S.p.A., Catania, Italy

[21] Appl. No.: 194,602

[22] Filed: May 16, 1988

[30] Foreign Application Priority Data

May 18, 1987 [IT] Italy .................. 20572 A/87

[51] Int. Cl.⁵ ............... H03K 17/74; H03K 3/01; H03K 17/687; H03K 3/45
[52] U.S. Cl. ................... 307/257; 307/270; 307/571; 307/314
[58] Field of Search ............ 307/241, 571, 257, 263, 307/228, 314, 270, 296.1, 296.3, 296.5; 361/152, 153; 400/157.2, 166; 101/43.29; 315/397, 408

[56] References Cited

U.S. PATENT DOCUMENTS

| | | | |
|---|---|---|---|
| 3,400,304 | 9/1968 | Ziegler | 361/152 |
| 3,435,375 | 3/1969 | Miller, Jr. | 307/241 |
| 3,448,299 | 6/1969 | Hierholzer, Jr. et al. | 307/314 |
| 3,934,173 | 1/1976 | Korver | 315/408 |
| 4,024,433 | 5/1977 | Korver | 315/397 |
| 4,112,428 | 9/1978 | Dorsman | 307/257 |
| 4,433,357 | 2/1984 | Nishimura et al. | 361/153 |
| 4,454,454 | 6/1984 | Valentine | 307/270 |
| 4,540,899 | 9/1985 | Pelly | 307/270 |
| 4,541,389 | 9/1985 | Kosak et al. | 361/152 |
| 4,683,387 | 7/1987 | Jones et al. | 307/571 |
| 4,737,696 | 4/1988 | Yokogawa et al. | 361/152 |

FOREIGN PATENT DOCUMENTS

| | | | |
|---|---|---|---|
| 0218288 | 4/1987 | European Pat. Off. | 307/571 |
| 1246359 | 7/1986 | U.S.S.R. | 307/571 |

Primary Examiner—Stanley D. Miller
Assistant Examiner—Trong Quang Phan
Attorney, Agent, or Firm—Guido Modiano; Albert Josif

[57] ABSTRACT

In this MOS-transistor bridge circuit, for obtaining a fast flyback conduction of the current after a normal operation of the circuit, instead of the flyback diodes associated with each transistor of the bridge, the MOS transistors themselves are employed, driven so as to conduct current from the ground to the power supply, that is in the opposite direction with respect to that of normal operation. For this purpose a control section is provided receiving at the input a fast flyback signal and comprising delay gates connected to the disable inputs of the transistors, so as to delay switching off thereof, and to maintain in the on state two diagonally opposed transistors so as to allow current to flow from the ground to the power supply through these diagonally opposed transistors and the load until the current decreases to zero.

10 Claims, 2 Drawing Sheets

MOS-TRANSISTOR BRIDGE CIRCUIT

BACKGROUND OF THE INVENTION

The present invention relates to a MOS-transistor bridge circuit.

As is known, MOS-transistor bridge circuits comprise four transistors, each connected in parallel to a respective flyback diode and controlled at the gate terminal by a circuit intended to ensure switching of the transistors according to three input signals, to obtain the desired operation, and powering a load at the desired current and/or voltage levels.

A known circuit of this type is shown in FIG. 1. Herein the MOS transistors 1-4, with the respective diodes 5-8, are driven by AND gates 11-14 according to the signals present on the inputs IN1, IN2 and EN. Respective inverter elements 15 and 16 connect the switching inputs of the AND gates driving the transistors of the same branch, so as to prevent their simultaneous switching on. On the transverse arm of the bridge an inductive load 9 is provided, and the bridge is connected between a supply voltage $V_{CC}$ and the ground through a resistor 10.

For the operation of the circuit of FIG. 1, suppose that each individual MOS transistor is in the on state when it receives a high signal at its gate terminal and, vice versa, is off if it receives a low signal. Accordingly, for each branch, the upper transistor is on when both the enable signal EN and the control or switching input IN1, IN2 are high. Vice versa the lower transistor of each branch is on when the control or switching signal is in the low state, but the enable signal is always high. Moreover the enable signal, if in the low state, is capable of switching off all four transistors simultaneously.

FIG. 1 also shows the diodes 5-8 connected in parallel to each transistor. These diodes may be formed for example by the intrinsic diodes obtained in the manufacture of the power MOS transistors (DMOS).

Accordingly, with a high signal on the gate terminal of each MOS transistor, the same is on and behaves like a resistor with value equal to $R_{DS(ON)}$ of the transistor with in parallel the intrinsic drain-source diode which intervenes in the inverse operating region to limit the excursion of the voltage across it. Vice versa, when the MOS transistor is off with $V_{GS}=0$, the equivalent circuit is constituted only by the diode, which can thus conduct the current in a direction opposite to that of normal operation of the MOS transistor.

FIG. 2 illustrates the behaviour of the current $I_{DS}$ versus the voltage $V_{DS}$, wherein the curve I, which is a straight line with slope $R_{DS}(ON)$, plots the resistive behaviour of the MOS transistor in on condition, while the curve II illustrates the behaviour, typical of the diode, when the transistor is off. From the plot of FIG. 2 it is furthermore apparent that with a negative current $I_1$ during flyback with the MOS transistor off, an operating voltage $V_2$ is obtained, entailing therefore a power dissipation equal to $P_{diss1}=V_2 \cdot I_1$.

Bridge circuits of the described type are extensively used for driving loads, in particular inductive loads such as motors and the like; however, due to the illustrated behaviour, in some cases they have an excessive power dissipation which it is desired to reduce.

SUMMARY OF THE INVENTION

Accordingly, the aim of the present invention is to provide a MOS-transistor bridge circuit capable of providing a fast current flyback with lower dissipation with respect to known bridges, so as to allow its use in an increasingly large number of applications.

Within this aim, a particular object of the present invention is to provide a bridge circuit which can be controlled by means of simple, easily producible elements, so as to obtain an overall circuit having a complexity comparable with, or only just greater than, that of known circuits.

Not least object of the present invention is to provide a bridge circuit having reliable operation in any condition.

The indicated aim, the mentioned objects and others which will become apparent hereinafter are achieved by a MOS-transistor bridge circuit, as defined in the accompanying claims.

In practice the invention is based on the observation that the bridge circuit has less dissipation if the MOS transistors are kept on during flyback, so as to conduct current in an opposite direction with respect to that of normal operation at a lower voltage with respect to the switching-on voltage of the associated diodes.

Therefore according to the invention the bridge circuit, to obtain fast current flyback, is not switched off by acting on the enable signal but is driven so that two of the four transistors remain on following the curve I of FIG. 2 also in the third quadrant, so that with reverse current $I_1$ the voltage across them is $V_1$, and on each MOS transistor in the on state there is a dissipated power $$P_{diss2}=V_1 \cdot I_1$$

obtaining therefore a dissipated power reduction equal to $$P_{diss}=(V_2-V_1)I_1$$

BRIEF DESCRIPTION OF THE DRAWINGS

Further characteristics and advantages of the invention will become apparent from t he description of a preferred but not exclusive embodiment, illustrated only by way of non-limitative example in the accompanying drawings, wherein.

DESCRIPTION OF THE PREFERRED EMBODIMENTS

Figure 3:
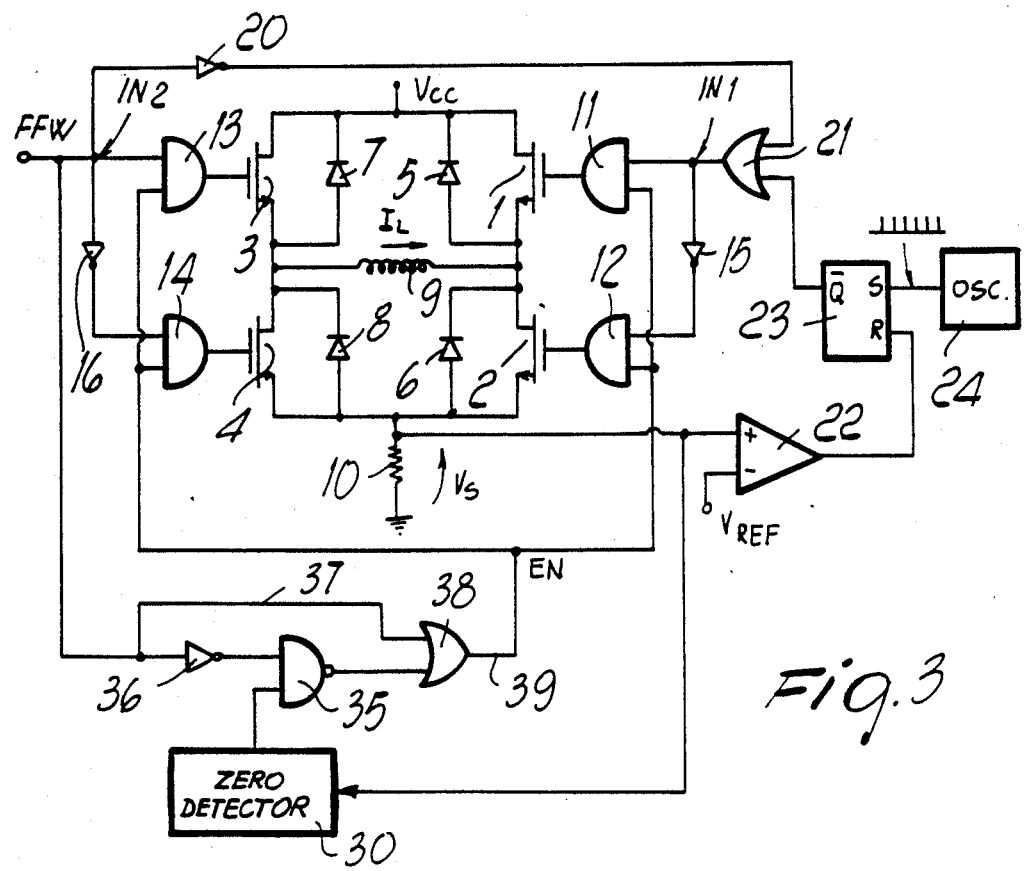
FIG. 3 is an equivalent electric diagram of the bridge circuit according to the invention, with an example of circuitry capable of driving the bridge circuit according to the desired operation.

With reference to FIG. 3, the bridge circuit according to the invention comprises a central part fully similar to known circuits, the elements whereof, for the sake of consistency, have been given the same reference numerals, and a driving part for the operation of the bridge circuit in the desired region.

Figure 1:
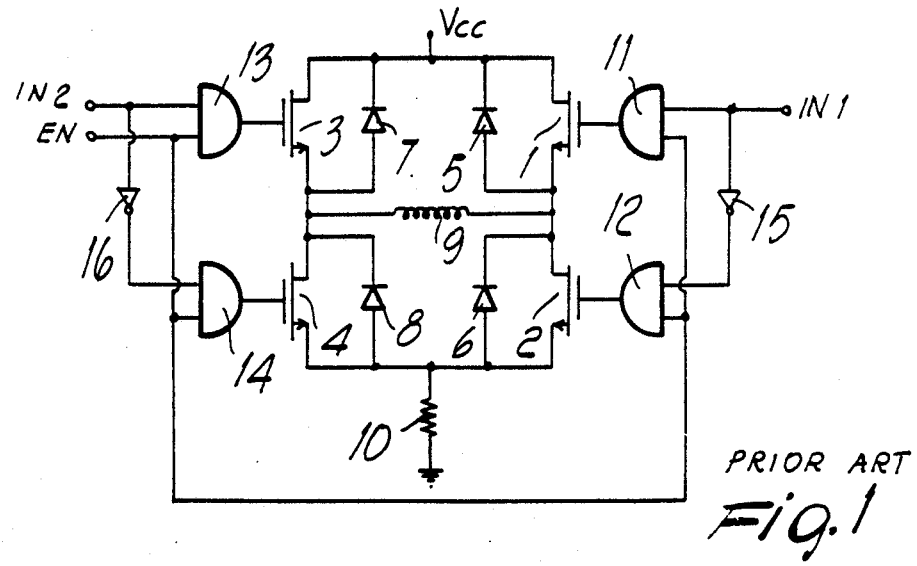
FIG. 1 is an equivalent electric diagram of the known bridge circuit.

In detail, the circuit of FIG. 3 again comprises four MOS power transistors 1–4, each associated with a respective diode 5–8 (constituted for example by the intrinsic diodes of DMOS transistors) and controlled at the gate terminal by respective AND gates 11–14. As in known circuits, each AND gate has a first enable input, receiving a signal EN, and a second control or switch input to drive in the on or off state the associated transistor. In detail, the gate 11 receives at the input the signal IN1 which is supplied, inverted by the inverter 15, also to the gate 12, while the gate 13 receives at the input the signal IN2 which is supplied, inverted by the inverter 16, also to the gate 14. As in FIG. 1, the bridge circuit is connected between a supply voltage $V_{CC}$ and the ground by a resistor 10, while 9 indicates the inductive load.

According to the invention, the circuit has been provided with a fast flyback control section intended to drive the bridge circuit in the operation region with lower dissipation. In detail, the control section comprises delay means receiving at the input a fast flyback signal FFW and supplying at the output the enable signal EN so as to switch off the transistors of the bridge only when the current flowing through the load is reduced to zero, and a switching section ensuring switching on of the MOS transistors during flyback.

Therefore, with reference to FIG. 3, the circuit has a fast flyback input, indicated at FFW, which is directly connected to the input IN2 of the AND gate 13 and connected through an inverter 20 and an OR gate 21 to the input IN1 of the gate 11. The fast flyback input is furthermore connected to the delay circuit which generates the enable signal EN. In detail, the input FFW is connected, through line 37, to an OR gate 38 and, through an inverter 36, to a NAND gate 35 the output whereof is brought to the second input of the OR gate 38 and the second input whereof is connected to the output of a zero-detector circuit 30 connected to the resistor 10.

Figure 4:
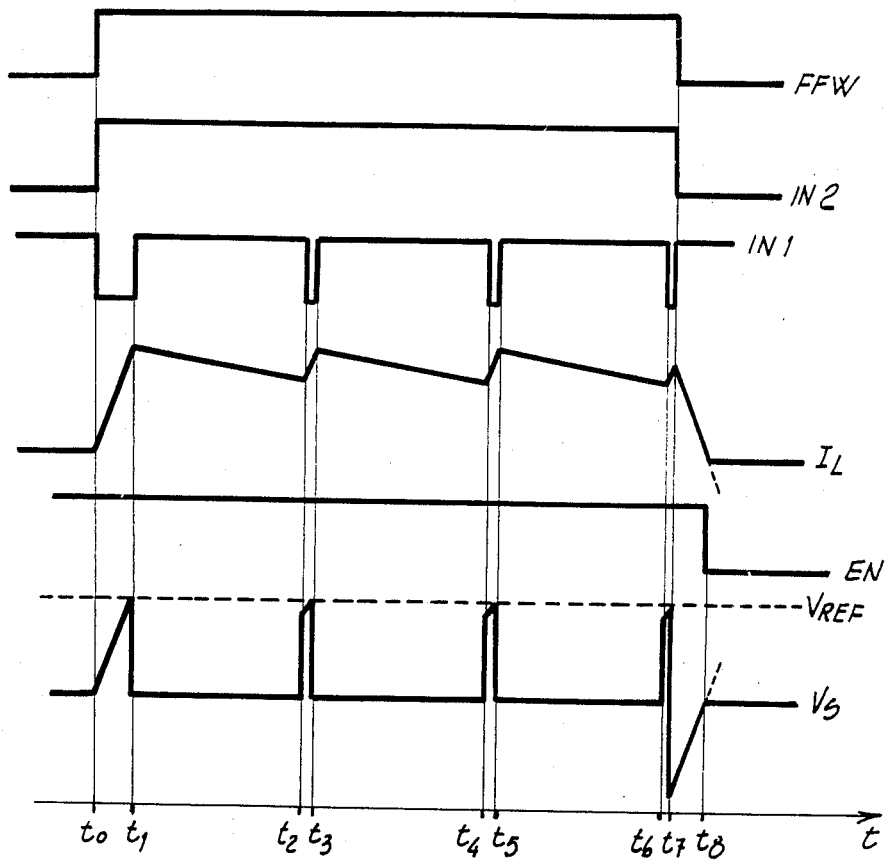
FIG. 4 plots the behaviour, versus time, of some signals taken at appropriate points of the circuit of FIG. 3.

The illustrated exemplifying circuit is completed by components intended to control the switching of the gates 11 and 12 and therefore of the transistors 1 and 2 during normal operation so that the current flowing in the load 9 has the waveform shown in FIG. 4. Said components comprise a comparator 22 connected with its positive input to the resistor 10 so as to detect the voltage drop existing on said resistor, which is proportional to the current flowing in the load, and connected with its negative input terminal to a reference voltage $V_{REF}$. The output of the comparator 22 is carried to the reset input R of a flip-flop 23 the set input S whereof is connected to the output of an oscillator 24 and the output $\overline{Q}$ whereof is brought to the second input of the OR gate 21. Of course the components 21–24 are intended to ensure current to flow in the load in the illustrated direction, and may be duplicated and appropriately connected and interposed between the fast flyback input FFW and the input IN2 to obtain a similar control of the current flowing in the load in the direction opposite to the one illustrated. Said circuit may furthermore be replaced with any other driving system or circuit adapted to obtain a load current with a desired value and behaviour, similarly to known circuits.

Thus, with reference to the example shown, initially, when the fast flyback signal switches from low to high, it immediately causes switching ON of the enable signal through the line 37 and the output 39 of the OR gate 38. Accordingly the gates 11 and 14 are enabled, while the signals present on the inputs IN1 and IN2 determine their operating state and therefore that of the associated transistors. Initially, therefore, after the time $t_0$ (see FIG. 4), the input IN2 is high, the input IN1 is low (the output of the flip-flop 23 being low at this moment) and current is supplied to the load through the transistor 3, said load 9, and the transistor 2 as well as the resistor 10. During this phase the current in the load grows linearly and the voltage across the resistor 10 increases. This phase lasts until the instant $t_1$ when the comparator 22 detects the equality between the voltage $V_S$ on the resistor 10 and the reference voltage $V_{REF}$ and therefore sends a reset signal to the flip-flop 23 which thus switches, sending a high signal to the OR gate 21. Accordingly the signal IN1 switches to the high state, causing switching on of the transistor 1 and switching off of the transistor 2, with current flyback through the same transistor 1. During this phase thus the current flowing through the load decreases linearly as shown in FIG. 4 in the time interval comprised between $t_1$ and $t_2$. Subsequently, at the instant $t_2$, the oscillator 24 feeds a set pulse to the flip-flop 23 which therefore switches again and sends a low signal to the input of the OR gate 21 which again sends a low signal to the gate 11, causing therefore switching off of the transistor 1 and switching on of the transistor 2. This behaviour continues as long as a high signal is present on the input FFW.

It will be thus appreciated that gates 11–14, 20, 21 and components 30, 35–39 define a switching control section receiving the fast flyback signal at input FFW and a switching control signal at the input of gate 21 connected to the output of flip-flop 23, the switching control section controlling transistors 1–4 so as to switch on transistors 3 and 2 when the fast flyback signal is at a first logical level (high) and the switching control signal is in a first logical state (low) and to switch on transistor 3 and transistor 1 when the fast flyback signal is at the first logical level and the switching control signal is in a second logical state (high).

Suppose now that at the instant $t_7$ the fast flyback input signal switches to the low state, to obtain a fast current flyback in the load and switching off of the circuit. As explained above, this phase was obtained, according to the prior art, by directly acting on the enable signal EN which simultaneously switched off the four gates 11–14 and then the associated transistors 1–4. This control allowed the power supply voltage to be fed to the load with appropriate sign to obtain a rapid decrease of the current according to the law $$\frac{dI_L}{dt} = \frac{V_{CC}}{L}$$

in which L indicates the inductance of the load. In fact, switching off the MOS power transistors 1–4 with current flowing in the load in the indicated direction caused switching on of the intrinsic diodes 5 and 8, with flyback of the current through the resistor 10, the diode 8, the load 9 and the diode 5 up to the complete reduction of the current with no need for further controls or synchronizations. With said known control, a dissipation linked to the drop existing on the two diodes 5 and 8 was therefore obtained which however, as previously indicated, could entail problems in particular applications.

Figure 2:
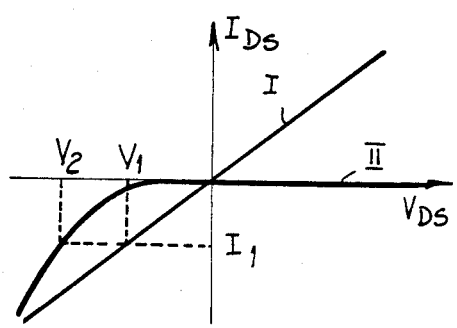
FIG. 2 plots the behaviour of the current and of the voltage for a MOS power transistor, in the on and off states.

According to the invention, instead, rapid current flyback is no longer obtained by switching off the driving transistors and conduction through the respective diodes, but by appropriately switching the MOS transistors so that they themselves flyback or conduct the flyback current in the opposite direction with respect to that of normal operation, allowing therefore operation of each MOS transistor at a lower voltage with respect to the operating one, with equal current, of the respective intrinsic diode, as illustrated in FIG. 2 for a current $I_1$. To obtain this driving operation, in the example according to FIG. 3 the fast flyback signal is sent directly to the gate 13 which therefore, on the input IN2, has a low signal, and, negated, to the gate 21 which therefore, for all this operating phase, keeps the output, defining the input IN1, in the high state, regardless of the operation of the current control circuit 22–24.

During this phase, the enable delay circuit is active and switches off the bridge circuit with a delay with respect to the fast flyback signal. In fact, after switching of the signal FFW, the enable signal EN remains in the high state since the output of the zero-detector 30 (which switches from the low state to the high state upon detection of the passage through zero of the voltage existing on the resistor 10) is still low, such as to keep the output of the NAND gate 35 in the high state, thereby maintaining the output 39 of the OR gate 38 in the high state. Accordingly all the gates 11–14 are enabled, through only the gates 11 and 14 are operative and keep the respective transistors 1 and 4 on. Thus the current flows through the resistor 10, the transistor 4, the load 9, the transistor 1, with the bridge operating at lower voltages and therefore lower dissipation with respect to the prior art. This flyback phase (in which the current in the load and the voltage detected by the resistor 10 have the behaviour shown in FIG. 4 in the interval comprised between the instants $t_7$ and $t_8$) ends when no more current flows in the load. In fact at this instant (instant $t_8$) the voltage on the resistor 10 (with negative value) is zero and tends to reverse its sign. This situation is detected by the detector circuit 30 which therefore switches with its output to the high state. Accordingly the NAND gate 35, receiving at its inputs two high signals, switches to the low state, causing therefore also switching of the OR gate 38 and of the enable signal EN to the low state. Accordingly the driving gates 11–14 and therefore the related transistors 1–4 are simultaneously disabled, with switching off of the circuit. The operation of the circuit may therefore be restored by returning the fast flyback signal FFW to the high state.

As is apparent from the previous description, the invention fully achieves the intended aim and objects. In fact, by driving power MOS transistors of the bridge circuit so that these appropriately conduct the fast flyback current instead of the respective associated diodes, an operation with lower power dissipation is obtained, allowing use of this circuit even in those cases in which it is desired to keep the dissipated power low for reasons of excessive heating or of reduction of power demand of the circuit. In fact, by appropriately switching on the flyback transistors, these behave like resistors, following the current curve indicated at I in FIG. 2 and therefore obtaining an improvement with respect to the conventional operation using the associated diodes with operation along the curve II of FIG. 2 with greater voltage.

The driving concept according to the invention, which entails a reduction of the dissipated power for bridge circuits of any type, both integrated and discrete, is even more advantageous in the case of integrated bridges. In fact, in the case of these last, each MOS transistor is associated to a parasitic bipolar transistor, always susceptible to switching on and intervening during the flyback phase, entailing in itself a dissipation of power.

Figure 5:
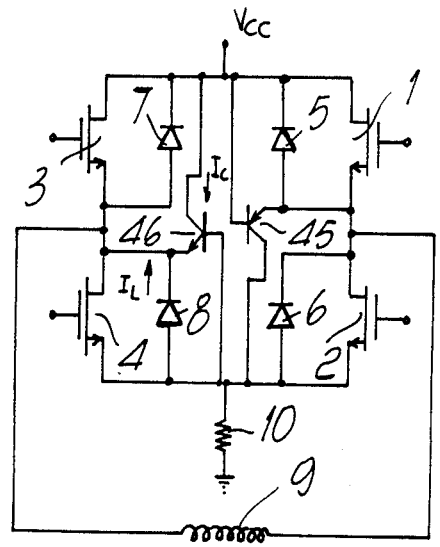
FIG. 5 is an equivalent diagram of only the bridge circuit, showing parasitic structures existing in integrated bridges.

For a greater understanding of this advantage, reference should be made to FIG. 5, illustrating the parasitic transistors, indicated at 45 and 46, typical of an integrated structure, and associated with the power MOS transistors 1 and 4, wherein for the sake of greater clarity, the parasitic transistors of the MOS transistors 2 and 3 have been ignored. As can be seen, the upper MOS transistor 1 is associated to a bipolar PNP transistor 45 having the base-emitter junction in parallel with the drain-source diode 5. In the case of the lower power MOS transistor 4, an NPN-type bipolar transistor 46 is instead formed, also having the base-emitter junction in parallel with the diode 8. These parasitic transistors, in the case of fast flyback through the diodes 5 and 8, according to the prior art, could be switched on and contribute to the power dissipated in the circuit, therefore aggravating the above described problems. In fact, with a current $I_L$ circulating through the structure formed by the diode and by the base-emitter junction of the parasitic transistor, since $$I_C = \frac{\beta}{\beta + 1} I_E$$

and since generally for parasitic transistors the relation $\beta << 1$ is valid, the collector current is $I_C \simeq \beta I_E = \beta I_L$. Consequently in each individual parasitic transistor a further power is dissipated equal to $P'_{diss} = 2V_{cc} \cdot I_L \cdot \beta$ which, through the fraction of current flowing through said parasitic transistor is low, is normally a non-negligible amount since the collector current is multiplied by the entire voltage supply.

This further dissipation is therefore eliminated with the driving operation according to the invention since, by virtue of the current flyback through the power MOS transistors which, as has been shown, operate at a lower voltage than the switching-on voltage of the diode and therefore of the parasitic transistor, prevent the operation of said parasitic transistors and therefore eliminate a cause of further dissipation.

The invention thus conceived is susceptible to numerous modifications and variations, all of which are within the scope of the inventive concept. In particular the fact is stressed that the delay circuit for the generation of the disable signal delayed with respect to the fast flyback signal, shown in FIG. 3, is merely exemplifying and may be replaced with any circuit capable of providing the same operation, for example a flip-flop connected with its set input to the fast flyback signal and with its reset input to the zero detector.

However, other solutions are conceivable, for example without closed loop control of the current circulating in the load. In fact, if, during stable operation, the load is made to work at a specific current, it is possible to approximately determine beforehand the time required in order that the current drops to zero, and therefore to cause the enable signal to switch to the low state with a delay equal to that time, without monitoring of the current flowing in the load.

Furthermore, the control circuit for switching the gates 11-14 may be completed symmetrically for switching on the transistors 2 and 3 and a fast current flyback through these in the case of current flowing in the opposite direction. Furthermore the driving circuit itself may be structured in any manner adapted to provide the desired adjustment.

Moreover, all the details may be replaced with other technically equivalent ones.

We claim:

1. A MOS-transistor bridge circuit, comprising a first branch including a first and second MOS transistors connected in series, a second branch including a third and a fourth MOS transistors connected mutually in series and in parallel with said first branch, said first and third transistors being furthermore connected to a first higher reference potential line and said second and fourth transistors being connected to a second lower reference potential line, each of said branches defining an intermediate tap for connection to a load, and four driving gate circuits, each associated with a respective transistor and comprising a first enable input terminal, a second switch input terminal and an output, said enable terminals being mutually connected and defining a common enable input, said switch input terminals of said gate circuits associated with said transistors of said first branch being mutually connected through a first inverter element and defining a first common control input, said switch input terminals of said gate circuits associated with said transistors of said second branch being mutually connected through a second inverter element and defining a second common control input, each of said outputs of said gate circuits being connected to a gate terminal of the respective associated transistor, said common enable input and said common control inputs receiving a circuit enable signal as well as control signals for switching on at least said first transistor and, alternatively, one of said third and fourth transistors and supplying a current to said load, said bridge circuit further comprising a fast flyback control section having a flyback input, an enable output connected to said common enable input and first and second control outputs respectively connected to said first and second control inputs, said fast flyback control section comprising selective delay means and means for controlling switching of said MOS transistors, said selective delay means having an input connected to said enable output and said means for controlling switching of said MOS transistors having a first input connected to said flyback input, a second input receiving a signal indicative of the current flowing in said load, and two outputs defining said first and second control outputs, said selective delay means receiving a fast flyback signal switching between a first and a second logical states and generating said enable signal at said common enable input when said fast flyback signal is in said first logical state and, maintaining said enable signal when said fast flyback signal is in said second logical state until the current in said load decreases to zero, and said switching means switching on said second and third, diagonally opposed MOS transistors for causing said current in the load to flow from said lower to said higher reference potential line with said fast flyback signal in said second logical state until said current in said load decreases to zero.

2. A circuit according to claim 1, comprising a line connected between said flyback input and the switch input terminal of said gate circuit connected to said first transistor and a further inverter element connected between said flyback input and the input terminal of said gate circuit connected to said third transistor.

3. A circuit according to claim 1, wherein said delay means comprises a current sensor element series connected to said load for detecting the amplitude of the current flowing through the load, a zero detector circuit connected to said current sensor element for generating a zero signal upon detection of zero current, and an enable gate having a first gate input connected to said flyback input and a second gate input connected to said zero detector circuit for generating said common enable signal with said fast flyback signal in said first logical state or with said fast flyback signal in said second logical state until reception of said zero signal.

4. A circuit according to claim 3, wherein said selective delay means also comprises a further inverter element having an input connected to said flyback input and a NAND gate having a first and a second inputs respectively connected to said further inverter element and to said zero detector and an output connected to said enable gate.

5. A bridge according to claim 4, wherein said enable gate is an OR gate having a first input connected to said flyback input and a second input connected to said NAND gate.

6. A process for fast current flyback in a MOS-transistor bridge having a first and a second branches in parallel, each comprising a pair of MOS transistors connected in series between a lower and a higher reference potential lines and defining intermediate taps mutually connected through a load, comprising the steps of switching on a first transistor of the first branch and, alternatively, a second transistor of the second branch facing the first transistor and a third transistor of the second branch diagonally opposed to the first transistor for supplying a current to the load from the higher reference potential line through the first and the third transistors to the lower reference potential line and, respectively, from the higher reference potential line through the first and the second transistor again to the higher reference potential line, wherein for obtaining a fast current flyback said first transistor of the first branch is switched off and a fourth transistor of the first branch and second transistor of said second branch diametrically opposed to said fourth transistor in said first branch are switched on for causing said current in the load to flow from said lower to said higher reference potential line and, upon the current in the load has decreased to zero, the MOS transistors are switched off.

7. A process according to claim 6, comprising the step of measuring the current in the load and sending a switch-off signal to said bridge upon detection of zero current, through a current sensor element arranged in series to the load and generating a switch off signal through a zero detector circuit connected to the current sensor element upon detection of zero current and supplying the switch off signal to the MOS transistors of the bridge.

8. A MOS-transistor bridge circuit, comprising a first branch including a first and a second MOS transistors mutually connected in series, a second branch including a third and a fourth MOS transistors mutually connected in series and in parallel with said first branch, with said first transistor in said first branch facing said third transistor in said second branch, said branches defining intermediate taps, a load connected between said two intermediate taps, a fast flyback signal switching between a first and a second logical level, a switching control signal switching between a first and a second logical state, a switching control section receiving said fast flyback signal and said switching control signal for switching on said first and third transistors with said fast flyback signal at said first logical level and said switching control signal in said first logical state, for switching on said first transistor and said fourth transistor with said fast flyback signal at said first logical level and said switching control signal in said second logical state and for switching on said second and third transistors with said fast flyback signal at said second logical level until the current in said load decreases to zero and then for switching off said first, second, third and fourth transistors.

9. A MOS-transistor bridge circuit, comprising a first branch including a first and a second MOS transistors mutually connected in series, a second branch including a third and fourth MOS transistors mutually connected in series and in parallel with said first branch, said first and third transistors being connected to a first reference potential line and said second and fourth transistors being connected to a second reference potential line, said branches defining intermediate taps, a load connected between said two intermediate taps, a fast flyback signal switching between a first and a second logical level, a switching control signal switching between a first and a second logical state, a switching control means for enabling a current to flow from said first reference potential line through said first and fourth transistors and said load to said second reference potential line with said fast flyback signal in said first logical level and said switching control signal in said first logical state, to flow from said first reference potential line through said first and said third transistors and said load again to said first reference potential line with said fast flyback signal in said first logical level and said switching control signal in said second logical state and to flow from said second reference potential line through said second and third transistors and said load to said first reference potential line with said fast flyback signal in said second logical level until the current in said load decreases to zero and then for switching off said first second, third and fourth transistors.

10. A circuit according to claim 9, comprising a current regulator connected to said load for detecting the amplitude of the current flowing in the load and for generating said switching control signal switching from said first to said second logical state when said amplitude exceeds a preset value.

* * * * *